(12) United States Patent
Chiu

(10) Patent No.: US 6,532,153 B1
(45) Date of Patent: Mar. 11, 2003

(54) HEAT SINK MOUNTING STRUCTURE

(76) Inventor: Mao tung Chiu, 1Fl., No. 15, Lane 31, Hua Hsing St., Pan Chiao City, Taipei Hsien (TW)

( * ) Notice: Subject to any disclaimer, the term of this patent is extended or adjusted under 35 U.S.C. 154(b) by 0 days.

(21) Appl. No.: 10/022,198

(22) Filed: Dec. 20, 2001

(51) Int. Cl.[7] .................................................. H05K 7/20
(52) U.S. Cl. ...................... 361/703; 165/80.3; 248/510; 257/719; 361/719
(58) Field of Search ................................. 257/718, 719, 257/722, 726, 727; 361/687, 702, 703, 704, 705, 717–719; 174/16.3; 165/80.3, 185; 248/316.7, 505, 510; 24/453, 457, 458, 625

(56) References Cited

U.S. PATENT DOCUMENTS

| | | | |
|---|---|---|---|
| 6,061,239 A | * | 5/2000 | Blomquist .................. 361/704 |
| 6,082,440 A | * | 7/2000 | Clemens et al. ........... 165/80.3 |
| 6,421,242 B1 | * | 7/2002 | Chen .......................... 361/704 |
| 6,480,384 B2 | * | 11/2002 | Lo ............................. 361/704 |

* cited by examiner

Primary Examiner—Gerald Tolin
(74) Attorney, Agent, or Firm—Bacon & Thomas, PLLC

(57) ABSTRACT

A heat sink mounting structure is constructed to include a bottom rack fixedly fastened to a motherboard by screws to hold a heat sink, two fasteners adapted for securing the heat sink to the bottom rack keeping the heat sink in contact with the CPU at the motherboard, each fastener having a double-end hook mounted in one locating groove of the heat sink and adapted for hooking in retaining holes in corner uprights of the bottom rack, a holding down plate adapted for holding down the double-end hook, and a locking lever pivoted to the double-end hook and adapted for locking the holding down plate.

3 Claims, 4 Drawing Sheets

HEAT SINK MOUNTING STRUCTURE

BACKGROUND OF THE INVENTION

1. Field of the Invention

The present invention relates to CPU heat sinks, and more particularly to a heat sink mounting structure, which can easily be locked to hold down the heat sink in close contact with the CPU.

2. Description of the Related Art

A variety of CPU heat sinks have been disclosed for use to dissipate heat from the CPU of a motherboard. During installation of a heat sink, fastening means must be used to fix the heat sink in position. Conventional fastening means for this purpose are commonly complicated. Further, conventional fastening means tend to be forced out of locking position when vibrated.

SUMMARY OF THE INVENTION

The present invention has been accomplished to provide a heat sink mounting structure, which eliminates the aforesaid drawbacks. According to one aspect of the present invention, the heat sink mounting structure comprises a bottom rack adapted for fastening to a motherboard by screws and holding a heat sink in close contact with the CPU at the motherboard, and two fasteners adapted for securing the heat sink to the bottom rack. According to another aspect of the present invention, each fastener comprises a double-end hook mounted in a respective locating groove of the heat sink and adapted for hooking in respective retaining holes in corner uprights of the bottom rack, a holding down plate adapted for holding down the double-end hook, and a locking lever pivoted to the double-end hook and adapted for locking the holding down plate.

DETAILED DESCRIPTION OF THE PREFERRED EMBODIMENT

Figure 1:
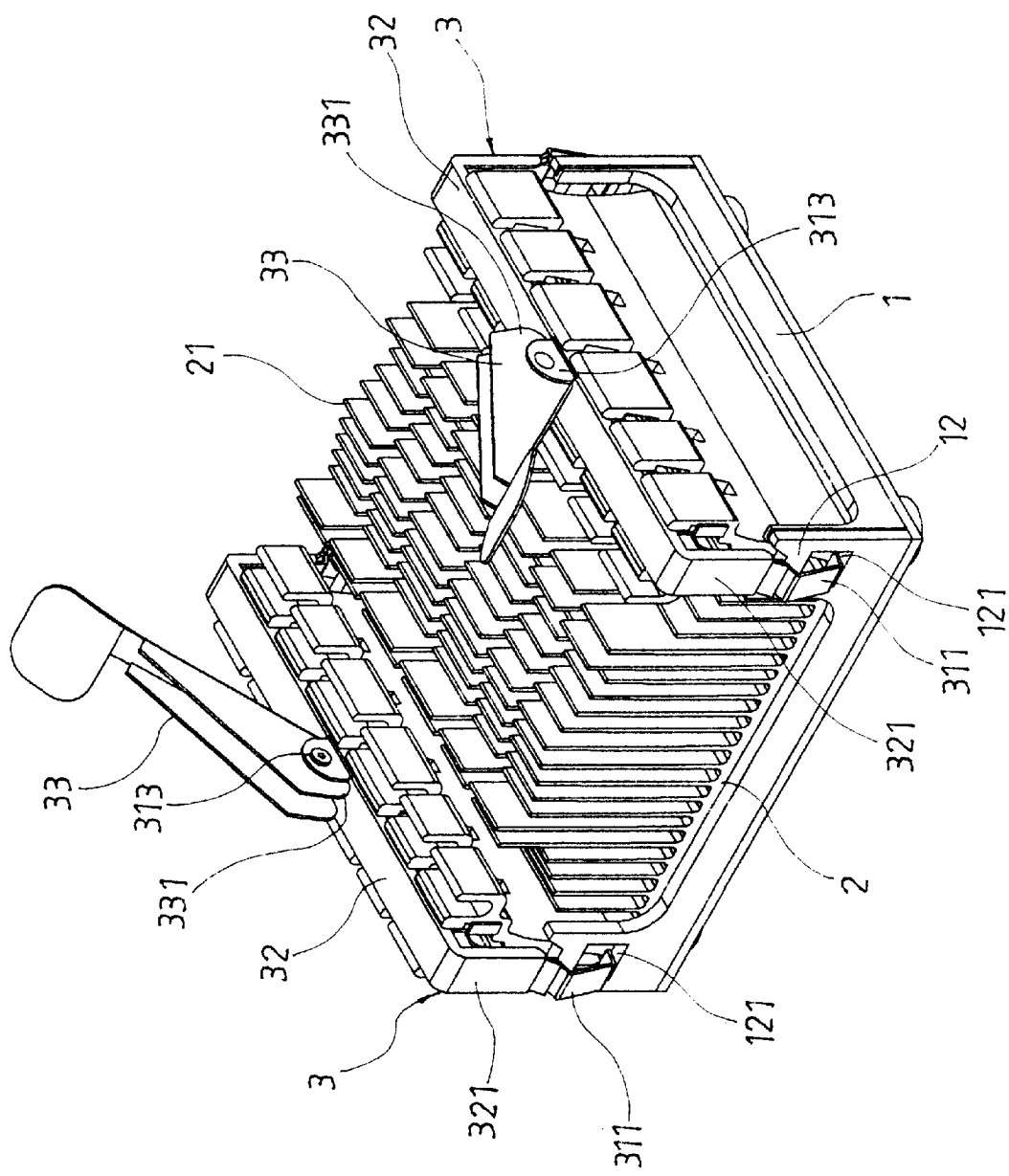
FIG. 1 is an elevational view of a heat sink mounting structure according to the present invention.
Figure 2:
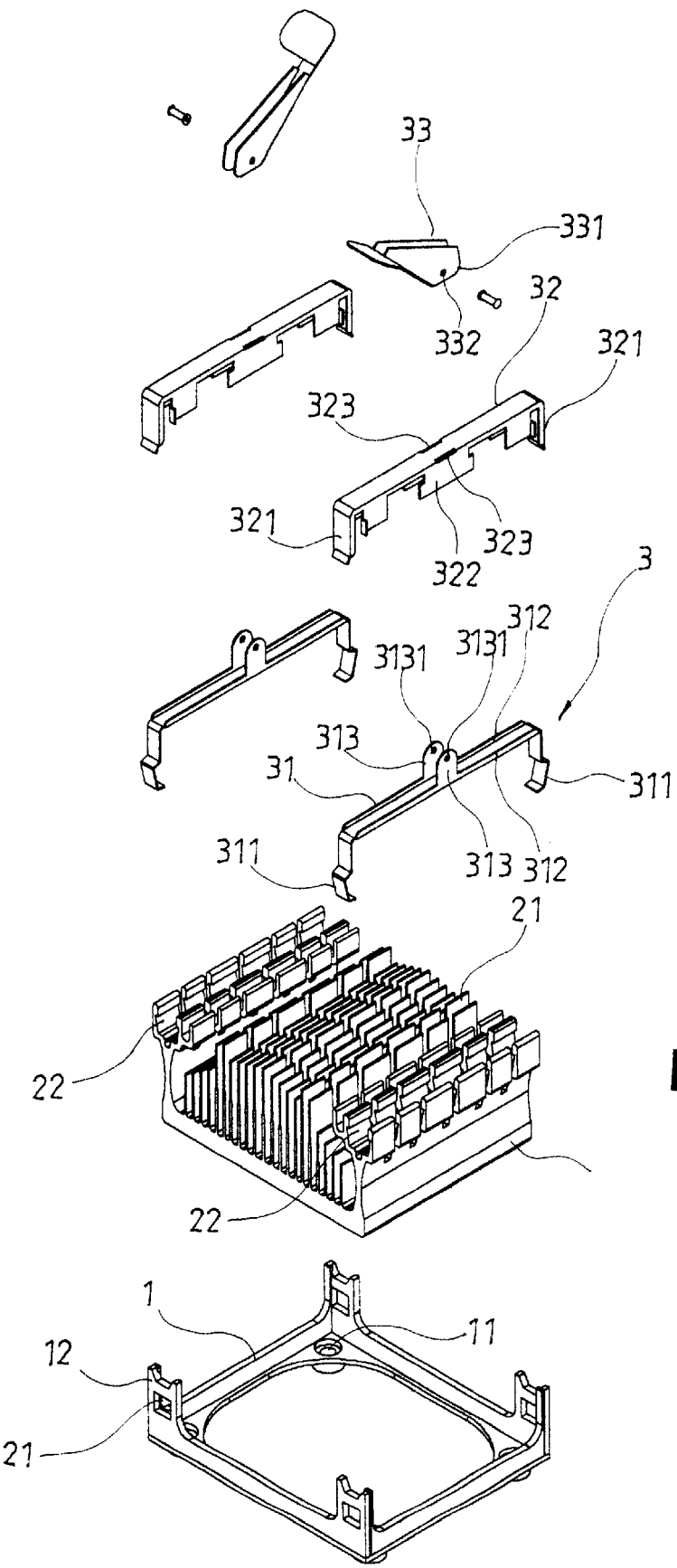
FIG. 2 is an exploded view of the heat sink mounting structure according to the present invention.

Referring to FIGS. 1 and 2, a heat sink mounting structure in accordance with the present invention is shown comprised of a bottom rack 1, a heat sink 2, and two fasteners 3.

The bottom rack 1 is a rectangular open frame having four uprights 12 respectively disposed in the four corners and four screw holes 11 respectively disposed near the uprights 12. The uprights 12 each have a rectangular retaining hole 121. The heat sink 2 comprises parallel rows of upright radiation fins 21, and two top locating grooves 22 of substantially Y-shaped cross section transversely disposed near two opposite sides. The fasteners 3 are respectively mounted in the top locating grooves 22 of the heat sink 2, each comprising an elongated double-end hook 31, an elongated holding down plate 32, and a locking lever 33. The double-end hook 31 comprises two longitudinal ribs 312 extended along two sides of the elongated base thereof, two hooked portions 311 respectively extended from two distal ends of the elongated base, and two parallel upward lugs 313 respectively upwardly extended from the longitudinal ribs 312 on the middle. The lugs 313 each have a pivot hole 3131. The holding down plate 32 is supported on the corresponding double-end hook 31, comprising two press portions 321 respectively extended from two distal ends thereof and pressed on the hooked portions 311 of the corresponding double-end hook 31, two through holes 323 bilaterally disposed on the middle for the passing of the lugs 313 of the corresponding double-end hook 31, and two positioning flanges 322 downwardly extended from a middle part thereof. The locking lever 33 has a cam 331 disposed at one end and stopped at the top side of the corresponding holding down plate 32, and a pivot hole 332 eccentrically transversely extended through the cam 331 and pivotally coupled to the pivot holes 3131 of the lugs 313.

Figure 3:
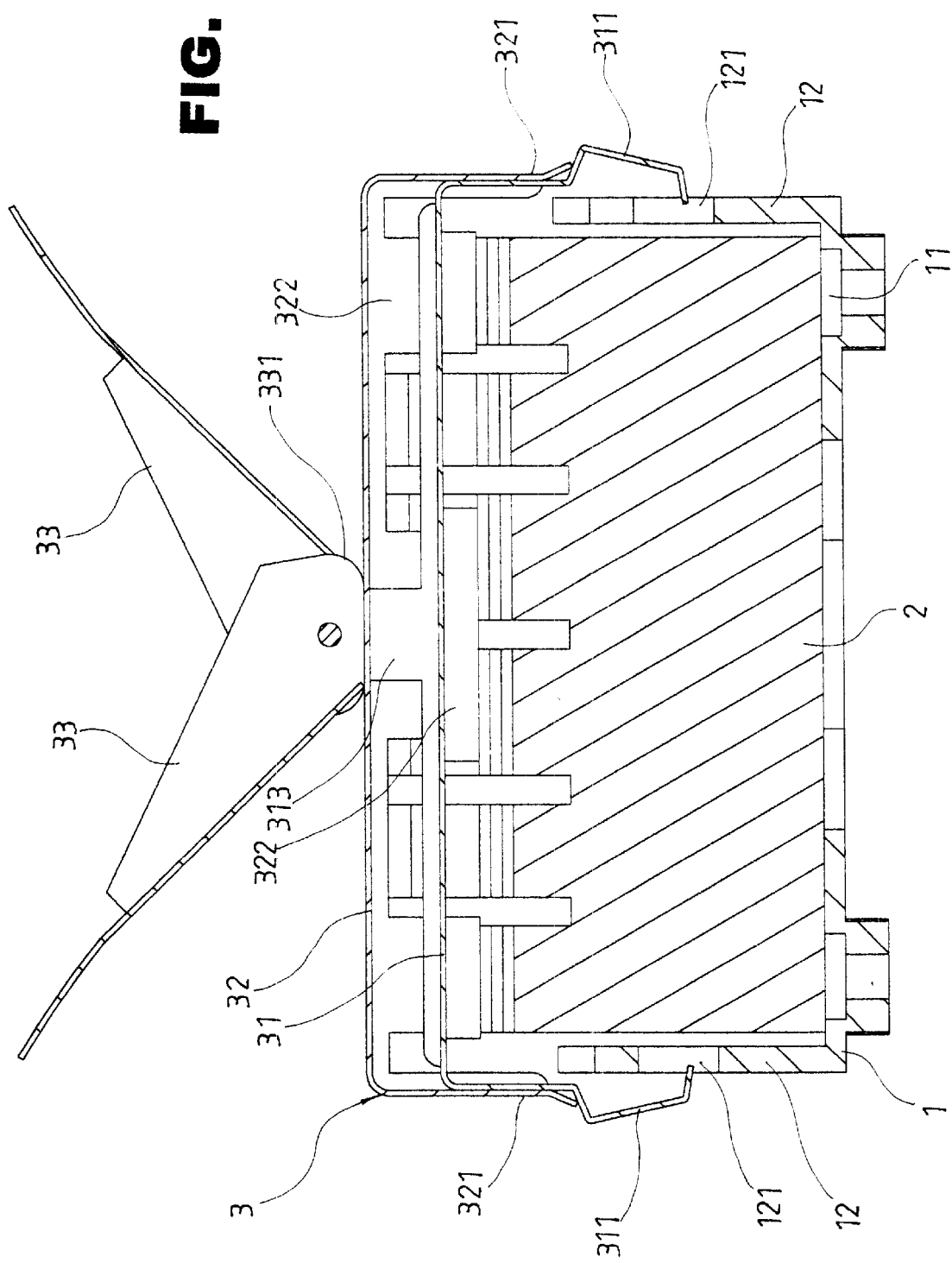
FIG. 3 is a sectional view in an enlarged scale of the heat sink mounting structure according to the present invention.
Figure 4:
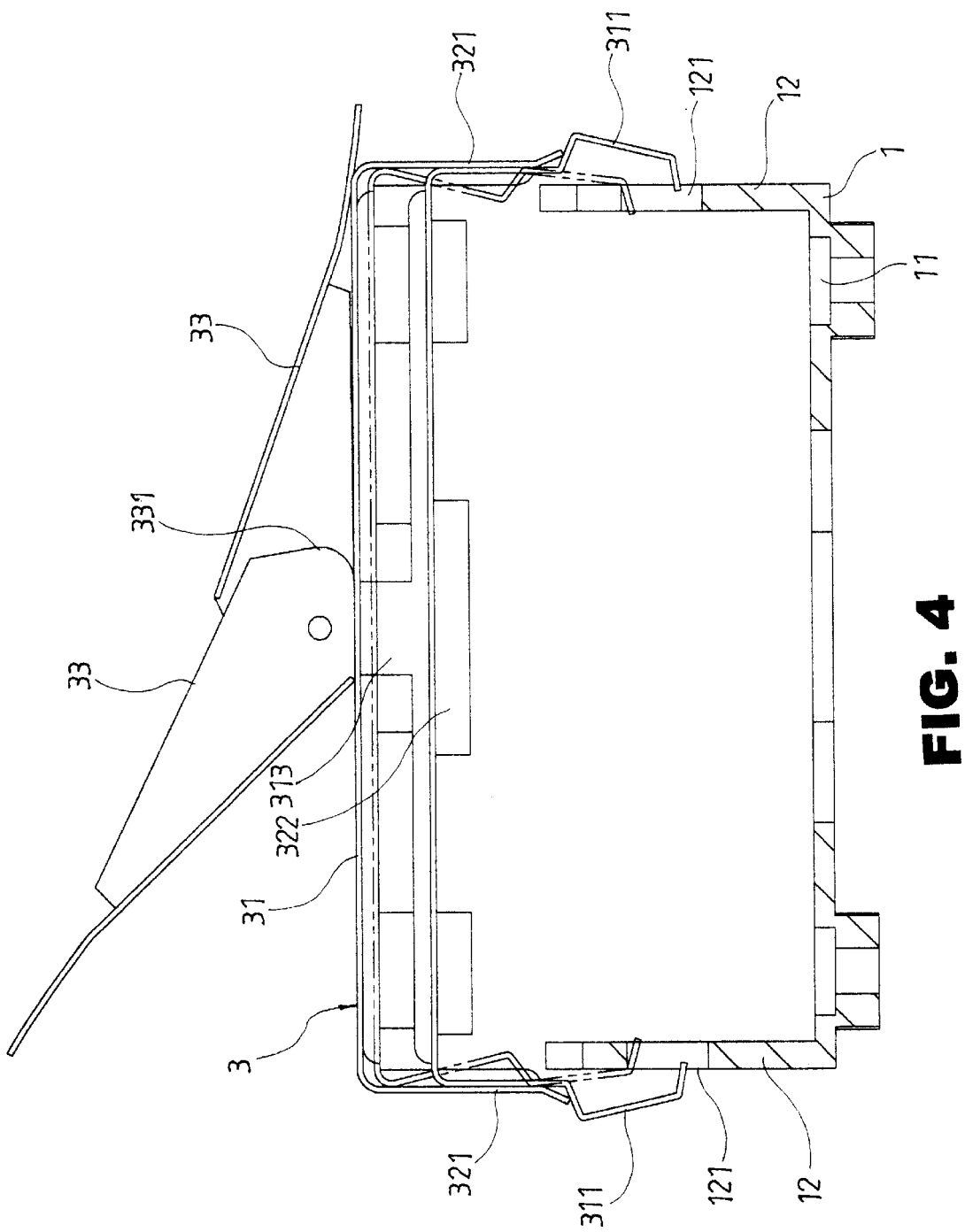
FIG. 4 is another sectional view of the present invention, showing one locking lever turned to the locking position.

Referring to FIGS. 3 and 4, the screw holes 11 of the bottom rack 1 is fixedly fastened to the motherboard (not shown) by screws, keeping the bottom sidewall of the heat sink 2 in close contact with the top sidewall of the CPU (not shown), and then the fasteners 3 are respectively mounted in the top locating grooves 22 of the heat sink 2 for enabling the hooked portions 311 of the double-end hooks 31 to be respectively engaged into the retaining holes 121 of the uprights 12 of the bottom rack 1, and then the locking levers 33 of the fasteners 3 are respectively turned in one direction to force the respective holding down plates 32 downward against the respective double-end hooks 31, keeping the press portions 321 of the holding down plates 32 respectively pressed on the hooked portions 311 of the double-end hooks 31, and therefore the heat sink 2 is held down and maintained in close contact with the CPU. When turning the locking levers 33 in the reversed direction respectively, the holding down plates 32 are released from the hooked portions 311 of the double-end hooks 31, enabling the fasteners 3 to be disconnected from the heat sink 2 and the bottom rack 1.

A prototype of heat sink mounting structure has been constructed with the features of FIGS. 1~4. The heat sink mounting structure functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A heat sink mounting structure comprising:

a bottom rack adapted for fastening to a motherboard around a CPU (central processing unit) on the motherboard, said bottom rack having a plurality of screw holes adapted for fastening to the motherboard and four uprights in four corners thereof, said uprights each having a retaining hole;

a heat sink mounted in said bottom rack and disposed in contact with the CPU of the motherboard in which said heat sink is installed, said heat sink comprising two top locating grooves of Y-shaped cross section transversely disposed near two sides; and two fasteners adapted for securing said heat sink to said bottom rack, said fasteners each comprising a double-end hook respectively mounted in the top locating grooves of said heat sink, said double-end hook having two hooked portions adapted for hooking in the retaining holes of said uprights of said bottom rack, and two upward lugs bilaterally disposed on the middle, a holding down plate attached to said double-end hook and adapted to hold the hooked portions of said double-end hook in the retaining holes of the uprights of said bottom rack, said holding down plate comprising two press portions respectively extended from two distal ends thereof and adapted for pressing on the hooked portions of said double-end hook, and a locking lever pivoted to said upward lugs of said double-end hook above said holding down plate and adapted for holding down said holding down plate.

2. The heat sink mounting structure as claimed in claim 1, wherein said double-end hook comprises two longitudinal ribs extended along two sides of an elongated base thereof for positioning.

3. The heat sink mounting structure as claimed in claim 1, wherein said holding down plate comprises two through holes bilaterally disposed in a middle part thereof through which said upward lugs of said double-end hook are inserted.

* * * * *